United States Patent [19]

Suwa et al.

[11] Patent Number: 4,679,942
[45] Date of Patent: Jul. 14, 1987

[54] METHOD OF ALIGNING A SEMICONDUCTOR SUBSTRATE AND A PHOTOMASK

[75] Inventors: Kyoichi Suwa, Yokohama; Hidemi Kawai, Kawasaki; Masaichi Murakami, Tokyo, all of Japan

[73] Assignee: Nippon Kogaku K. K., Tokyo, Japan

[21] Appl. No.: 703,941

[22] Filed: Feb. 21, 1985

[30] Foreign Application Priority Data

Feb. 24, 1984 [JP] Japan .................................. 59-33983
Feb. 24, 1984 [JP] Japan .................................. 59-33984

[51] Int. Cl.⁴ .............................................. G01B 11/00
[52] U.S. Cl. .................................................... 356/401
[58] Field of Search ......................... 250/557; 355/53; 356/399, 400, 401

[56] References Cited

U.S. PATENT DOCUMENTS 4,007,988  2/1977  Bromfield et al. .................. 355/133
4,172,664 10/1979  Charsky et al. ..................... 356/400
4,356,223 10/1982  Iida et al. ............................ 356/401
4,362,389 12/1982  Koizumi et al. .................... 356/401
4,419,013 12/1983  Heimer ................................. 356/400

Primary Examiner—F. L. Evans
Attorney, Agent, or Firm—Shapiro and Shapiro

[57] ABSTRACT

This specification discloses an alignment method for aligning a photomask with a substrate covered with a photosensitive layer and printing the pattern of the photomask on the substrate. The method comprises the steps of providing a reference mark on the photomask, providing on the substrate a pair of alignment marks correlated to the reference mark, the pair of alignment marks being spaced apart from each other by a predetermined distance in a mark area, one of the pair of alignment marks being formed projectedly relative to the surroundings thereof and the other alignment mark being formed as a depression relative to the surroundings thereof, providing the photosensitive layer on the substrate so that the outermost surface of the layer is substantially flat, and imaging the reference mark and the pair of alignment marks superposedly on an imaging plane by a light having a single wavelength. The specification also discloses a photomask and an apparatus for executing such method.

11 Claims, 23 Drawing Figures

METHOD OF ALIGNING A SEMICONDUCTOR SUBSTRATE AND A PHOTOMASK

BACKGROUND OF THE INVENTION

1. Field of the Invention

This invention relates to the copying of a photomask pattern onto a workpiece, particularly, a semiconductor substrate, and also to an alignment mark used to align the substrate and the photomask relative to each other prior to the projection of the photomask pattern onto the substrate.

2. Description of the Prior Art

A projection exposure apparatus is often used when a pattern on a reticle or a photomask is to be copied onto a semiconductor substrate to which photoresist is applied. In this exposure apparatus, a pattern depicted on a reticle or a photomask is projected through a projection optical system, for example, a 1/5 reduction projection lens, and the projected image is aligned with a photosensitive substrate (a wafer or the like) on which a pattern has been pre-formed and is superposedly printed on the substrate, whereby the lithography of a desired semiconductor device is effected. In this case, if the projected image of the pattern of the photomask is not accurately imaged on the wafer, a blurred pattern will be formed on the wafer, thus causing a problem of so-called unsatisfactory resolution.

Further, if the projected image and the pattern formed on the wafer are not accurately aligned, there will be caused a problem that the characteristic of the semiconductor device manufactured becomes insufficient or that in an extreme case, the operation of the semiconductor device itself becomes impossible. To solve such problem, it is required that the projected image be accurately focused to the surface of the wafer and the photomask and the wafer be accurately aligned. For this alignment, in recent years, a so-called through-the-lens (TTL) type alignment apparatus has come to be used in which an alignment mark formed on a wafer through a photomask and a projection optical system is observed with the alignment mark on the mask. In this TTL system, the mark on the wafer and the mark on the mask are detected at a position whereat they are to be projected and exposed through the projection optical system and therefore, high alignment accuracy can be expected. This TTL type alignment apparatus is disclosed, for example, in U.S. Pat. No. 4,362,389 issued on Dec. 7, 1982. In this patent, there is disclosed an apparatus in which, on a predetermined chip formed as a matrix on a wafer, a linear wafer alignment mark whose extensions intersect so as to be substantially orthogonal to one another, and which is arranged radially outwardly from the center of the chip, and another wafer alignment mark are separately formed and a square or linear reticle alignment mark is formed at a position of a photomask corresponding to the position of said linear wafer alignment mark. A projection lens is disposed between the wafer and the mask and further, an X-Y table on which the wafer is placed is step-advanced with each chip spacing. The wafer alignment mark and the reticle alignment mark superposed one upon the other at at least two locations by the projection lens are illuminated, and the optical images thereof are picked up by an image pickup device. From the resultant image signals, the relative displacements of the two marks (with respect to the X-axis direction and the Y-axis direction) are detected, and the wafer and the mask are moved relative to each other so that each detected displacement may become null.

The wafer alignment mark is a linear projection or a linear groove formed on a semiconductor substrate, and the alignment of the wafer and the mask is usually effected with photoresist being applied to the wafer. In the use of the alignment apparatus as described above, the wafer alignment mark is illuminated by a monochromatic light (of the same wavelength as the exposure light) through the photomask and the projection lens, and the alignment mark of the wafer and the alignment mark of the mask are superposedly imaged on a predetermined conjugate surface. These images are picked up by the image pickup device and converted into image signals, which are then subjected to predetermined signal processing to thereby align the mask and the wafer. In the portion of the wafer corresponding to the alignment mark the illuminating light partly reflected by the surface of the photoresist film and the illuminating light reflected by the surface of the semiconductor substrate interfere with each other.

When the optical refractive index of the photoresist is n and the thickness of the photoresist film is d, the optical distance D between the surface of the photoresist and the surface of the semiconductor substrate can be expressed as $D=n.d$. Accordingly, the condition under which the interference phenomenon occurs is $n.d=\lambda/2$, where $\lambda$ is the wavelength of the monochromatic illuminating light. That is, $d=\lambda/2n$. If, for example, a monochromatic light of $\lambda=436$ is used for the illumination, and $n \div 1.67$, $d \div 130$ nm. Thus, when the thickness of the photoresist film is integer times 130 nm, interference fringes occur.

The alignment mark of a wafer is generally comprised of a projection or a groove formed on the surface of a semiconductor substrate via the etching process. The alignment mark is discriminated by a difference level formed between this projection or groove and its surroundings. Photoresist uniformly applied to the surface of the semiconductor substrate including the alignment mark is liquid having suitable viscosity and surface tension in the step during which it is applied to the substrate and therefore, the thickness of the photoresist itself is small in the portion thereof corresponding to the projection on the substrate and great in the portion thereof corresponding to the groove. That is, the thickness of the photoresist film differs greatly.

Near the difference level at the boundary of the alignment mark, the thickness of the photoresist film varies gently so that it becomes gradually small or great away from the difference level. If a portion of the thickness which satisfies the above-described interference condition exists in this gentle variation, the interference phenomenon will occur in such portion and as a result, interference fringes will occur along the difference level edge.

The position of the alignment mark of the wafer is recognized by detecting, for example, the rising portion and the falling portion of the image signal corresponding to the contrast of the projected image by the projection lens and detecting the middle of the rising portion and the falling portion. Thus, if interference fringes occur, the position of the alignment mark of the wafer will be erroneously recognized.

SUMMARY OF THE INVENTION

It is an object of the present invention to improve the method of transferring a photomask pattern onto a semiconductor substrate and to improve the strict alignment of the photomask and the semiconductor substrate by forming on the substrate an alignment mark capable of making an image signal of good S/N ratio without being affected by occurrence of interference fringes.

According to the present invention, the above object is achieved by forming on a semiconductor substrate at least one alignment mark pair comprising a first mark having a predetermined minute width and a second mark having a width greater than said predetermined minute width and provided near said first mark.

It is when the width of the projection or groove on the substrate constituting the mark is about 4 μm or more that interference fringes occur near the difference level of the alignment mark of the substrate and offer a problem. When this width is less than about 4 μm, the surface of photoresist is substantially flat due to the viscosity of the photoresist. Therefore, the thickness of the photoresist film steeply varies with the difference level at the boundary and the number of interference fringes, if they occur, is only one or so and therefore, the S/N ratio of the image signal is good.

Accordingly, in the present invention, the width of said first mark may preferably be less than 4 μm.

Further, according to the present invention, the above object is achieved by forming on a semiconductor substrate at least one alignment mark pair comprising a mark formed projectedly from the surface of the substrate and a mark formed depressedly from the surface of the substrate near said projected mark. For a similar reason, the width of the marks may preferably be less than 4 μm.

According to the present invention which thus uses an alignment mark pair comprising marks of different sizes or a pair of projected mark and a depressed mark formed on a semiconductor substrate, interference fringes may occur on one of the marks of the pair but may not occur on the other mark of the pair or become negligible if they occur on the other mark. Accordingly, during alignment, one of the marks can be selected.

Further, by forming at least one pair of alignment marks comprising a projected mark and a depressed mark each having said minute width and another pair of alignment marks comprising a projected mark and a depressed mark each having a width greater than said minute width, the degree of freedom of the selection of the marks during alignment can be increased.

Plural pairs or plural sets of said alignment marks of the wafer may be used in an alignment method in which alignment is effected by the use of alignment marks provided at different positions during each cycle of exposure, more particularly, an alignment method in which a number of alignment marks equal to the number of times of exposure are provided on a wafer. During a cycle of exposure, one of those marks is used to align the wafer with a photomask, but because the mark once used for alignment may be deformed by the exposure and developing process it is not used again, and one of the remaining marks is used during the next cycle of exposure.

A pair or a set of alignment marks may be prepared in a method as disclosed in U.S. Pat. No. 4,007,988 issued on Feb. 15, 1977 wherein an alignment mark formed in the first printing process to a wafer is commonly used for the series of alignments with a photomask in the subsequent printing process.

Improvements in the alignment mark of a photomask which is alignable with the thus characterized alignment mark of a wafer are further provided by the present invention. On the alignment portion of the photomask, there is provided an index pattern for representing a position with which the alignment mark of the wafer is to be aligned.

DETAILED DESCRIPTION OF THE PREFERRED EMBODIMENTS

Figure 1:
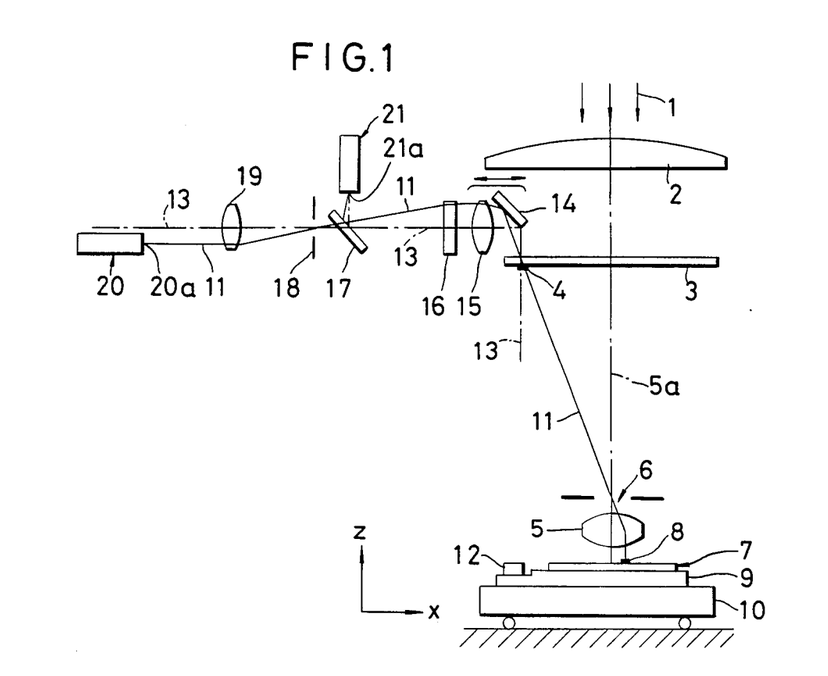
FIG. 1 schematically shows the optical arrangement of a projection exposure apparatus suitable for an embodiment of the present invention.

FIG. 1 schematically shows the optical arrangement of a projection type exposure apparatus. An exposure light beam 1 is supplied from a light source unit, not shown, and illuminates a reticle (mask) 3 with the aid of a main condenser lens 2. The image of the light source is formed in the entrance pupil plane 6 of a projection lens 5 by the main condenser lens 2. A predetermined pattern is formed on the surface of the reticle 3 which is adjacent to the projection lens 5, i.e., the pattern surface, and this pattern is reduction-projected onto the photosensitive surface of a wafer 7 at a predetermined magnification by the projection lens 5. The exposure light beam 1 is a light effective to sensitize photoresist applied to the photosensitive surface of the wafer, and may be a light of single wavelength such as a light of wavelength 435.8 nm (g-line) generated, for example, from a super-high pressure mercury lamp or a light of wavelength 365 nm (i-line).

In addition to the foregoing exposure optical system, an alignment optical system is provided for observing therethrough the positional relation between an alignment mark 8 provided on the wafer 7 and an alignment mark 4 provided on the marginal portion of the pattern surface of the reticle is as will hereinafter be described, and a light of the same wavelength as that of the exposure light beam 1 is used as an alignment illuminating light.

A reflecting mirror 14, a first objective lens 15 and a second objective lens 16 are provided above the peripheral edge of the reticle 3. The optic axis 13 of the first objective lens 15 is bent at a right angle by the reflecting mirror 14 and is orthogonal to the pattern surface of the reticle. Accordingly, the optic axis 13 is substantially parallel to the optic axis 5a of the projection lens and the forward focus of the first objective lens 15 is positioned on the pattern surface of the reticle. The first objective lens 15 and the reflecting mirror 14 are movable together along the optic axis 13 while maintaining this positional relation. Further, the portion between the first objective lens 15 and the second objective lens 16 is always collimated, and a stop 18 provided at the rearward focus position of the second objective lens 16 is conjugate with the pattern surface of the reticle with respect to the first and second objective lenses and is also conjugate with the photosensitive surface of the wafer with respect to the projection lens 5.

A condenser lens 19 is provided rearwardly of the stop 18 to limit the illuminated area on the wafer, and the focus thereof is coincident with the position of the stop 18. The condenser lens 19 is disposed on the optic axis 13 of the first and second objective lenses. The exit surface 20a of a light guide 20 for supplying an illuminating light of the same wavelength as that of the exposure light beam 1 has its center provided off the optic axis 13.

A beam splitter 17 is disposed between the stop 18 and the second objective lens 16. An image pickup apparatus 21 such as a television camera is provided in the optical path divided by the beam splitter 17, and the image pickup surface 21a of the image pickup apparatus 21, like the stop 18, is conjugate with the pattern surface of the reticle with respect to the first and second objective lenses 15 and 16 and is also conjugate with the photosensitive surface of the wafer.

By such a construction, the light beam from the light guide 20 is supplied to the alignment mark 8 provided on the photosensitive surface of the wafer and the alignment mark 4 provided on the pattern surface of the reticle, and the images of the alignment marks 4 and 8 are both observed by the image pickup apparatus 21. In FIG. 1, the principal ray 11 passing through the alignment mark 4 and the alignment mark 8 is indicated by a solid line. The principal ray 11 from the alignment mark 8 emerges from the first objective lens 15, whereafter it becomes parallel to the optic axis 13 and is reflected by the beam splitter 17, whereafter it reaches the center of the image pickup surface 21a of the image pickup apparatus 21. On the other hand, the principal ray 11 passing through the beam splitter 17 passes through the center of the stop 18, is refracted by the condenser lens 19, and becomes parallel to the optic axis 13 and reaches substantially the center of the light guide 20. That is, this principal ray 11 corresponds to the principal ray of the illuminating light supplied from the light guide 20.

Also, the first objective lens 15 and the reflecting mirror 14 are moved together in the direction of the optic axis 13 in accordance with the position of the alignment mark 4 on the reticle.

Another such alignment optical system is provided in a direction perpendicular to the plane of the drawing sheet of FIG. 1, and two-dimensional positional deviation of the reticle and the wafer is detected by these two alignment optical systems.

Now, in the construction of FIG. 1, the portion between the reticle and the projection lens is a non-telecentric optical system and the portion between the projection lens and the wafer is a telecentric optical system. In this case, if the mark on the reticle is provided at a position through which the optic axis 5a of the projection lens does not pass, for example, on the marginal portion of the reticle, the illuminating light beam of that mark, i.e., the principal ray 11 of the alignment optical system, becomes coincident with a line passing through that mark and the center of the pupil 6 of the projection lens and thus, becomes inclined with respect to the optic axis 5a of the projection lens, that is, the principal ray 11 does not become perpendicular to the pattern surface of the reticle, but becomes inclined by a certain angle. Therefore, even if the alignment mark 4 on the reticle is formed of a thin metal film and has a light-reflecting property, the reflected light of the light which has illuminated that mark does not return toward the alignment optical system and the image pickup apparatus 21, but travels in another direction and thus, that mark is illuminated by the light reflected by the wafer and the optical image of the alignment mark 4 is picked up as a blackish shadow. Thus, where the reticle side is a non-telecentric optical system, the alignment mark 4 formed on the reticle may have a light-reflecting and light-intercepting property or a light-absorbing property.

Also, where both the reticle side and the wafer side are telecentric optical systems, the principal ray 11 becomes perpendicular to the reticle (parallel to the optic axis 5a of the projection lens) and therefore, the mark on the reticle may have a light-absorbing property or there may be provided an optical system having a polarization separating characteristic in which the reticle is illuminated by a polarized light and a member for changing the polarized state (for example, a quarter wavelength plate) is inserted in the optical path between the reticle and the wafer so as to black the reflected light from the alignment mark 4 and transmit the reflected light from the wafer.

The wafer is vacuum-attracted to a wafer holder 9. A stage 10 is movable two-dimensionally (in direction x and direction y orthogonal to each other) on a base, and the wafer holder 9 is provided on this stage 10 and movable therewith two-dimensionally. Also, the wafer holder is movable relative to the stage in the direction of the optic axis of the projection lens (direction z). A reference mark alignable with the alignment mark 4 on the reticle is provided on a reference mark plate 12, and is used when the positions of the reticle and the stage are prescribed. The surface portion of the reference mark plate 12 other than the reference mark has a predetermined reflection factor and is fixed to the wafer holder 9.

Figure 2:
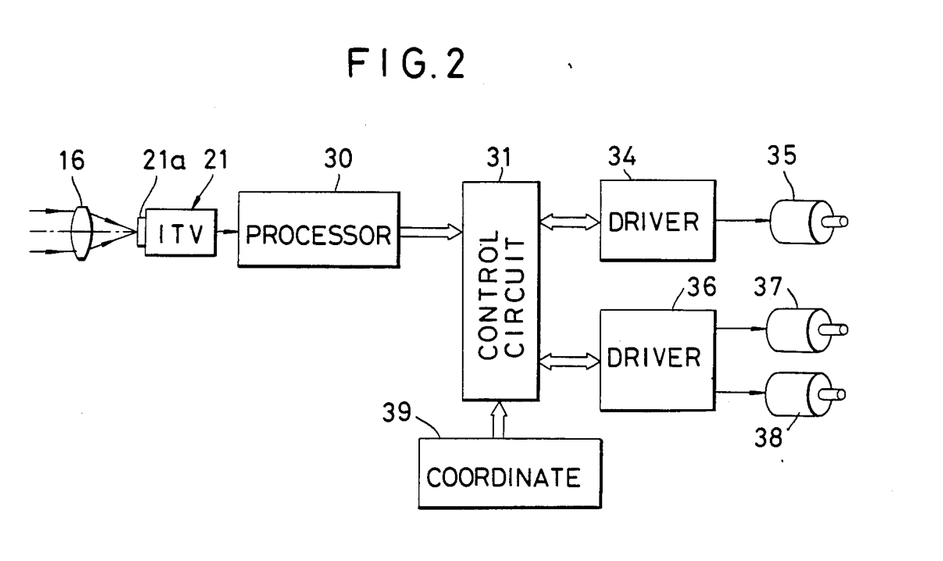
FIG. 2 is a circuit block diagram of the control system of the exposure apparatus of FIG. 1.

The light and dark portions of the image of the alignment mark 4 or 8 formed by the second objective lens 16 are photoelectrically converted by the image pickup apparatus 21, and the image signal thereof is input to a processing circuit 30 shown in FIG. 2. The processing circuit 30 processes the image signal and detects the contrast of the image formed on the image pickup surface 21a, and puts out to a control circuit 31 the detected information corresponding to the amount of relative positional deviation of the two alignment marks.

Figure 3:
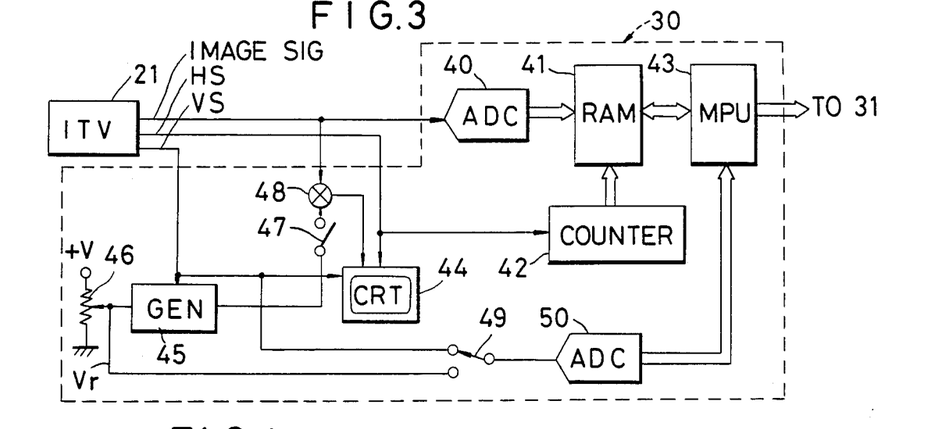
FIG. 3 is a specific circuit block diagram of the signal processing circuit of FIG. 2.

The processing circuit 30 is constructed as shown in FIG. 3. The magnitude (level) of the image signal from the image pickup apparatus 21 is converted into a digital value by an analog-digital converter (hereinafter referred to as ADC) 40, and the digital value is stored in a random access memory circuit (hereinafter referred to as RAM) 41. Also, a synchronizing signal for horizontal scanning lines (horizontal periodic signal) HS is put out from the image pickup apparatus 21, and a counter 42 produces 1024 pulses during one scanning period so as to divide one scanning line, for example, into 1024 picture elements, on the basis of the horizontal periodic signal HS, and counts the pulses in succession. The count value is applied as an address signal to the RAM 41 and as a result, the level of each picture element of the image signal corresponding to one scanning line is stored in the RAM 41 in the order of addresses. A microprocessor (hereinafter referred to as MPU) 43 controls the writing-in and reading-out of the RAM 41 and calculates the amount of positional deviation between the alignment mark 4 and the alignment mark 8 on the basis of the image data stored in the RAM 41. Also, a vertical scanning signal VS of saw-tooth waveform for two-dimensional scanning is put out from the image pickup apparatus 21 and is applied to a cathode ray tube (hereinafter referred to as CRT) 44 with the aforementioned image signal and horizontal periodic signal HS. The CRT 44 displays the picked-up image and also displays a horizontal cursor line. The cursor line is produced by a variable resistor 46 such as a resistor controlled by a joy stick for inputting the vertical position of the cursor line, a cursor signal generator 45 for generating a pulse-like cursor signal when a voltage Vr set by the variable resistor 46 is coincident with the voltage of the vertical scanning signal VS, and an adder 48 for adding the cursor signal to the image signal through a switch 47. Also, the set voltage Vr from the variable resistor 46 and the vertical scanning signal VS are alternatively input to an analog-digital converter (hereinafter referred to as ADC) 50 through a switch 49. The ADC 50 converts one of the set voltage Vr and the vertical scanning signal VS into a digital value and puts it out to the MPU 43. In such a construction, when the cursor line is to be displayed, the switch 47 may simply be closed and the vertical display position thereof may be determined simply by adjusting the variable resistor 46. Also, it is to be understood that the switch 47 and the switch 49 are automatically changed over by the MPU 43 in accordance with a predetermined program.

As shown in FIG. 2, a motor 35 driven by a driving circuit 34 moves the wafer holder 9 in direction Z, and the amount of movement thereof is controlled by driving information put out from the control circuit 31. Further, motors 37 and 38 driven by a driving circuit 36 move the stage 10 in direction x and direction y, respectively, and the amount of movement thereof is controlled by driving information put out on the basis of the detection information from the control circuit 31. The two-dimensional position of the stage, i.e., the coordinates position of the orthogonal coordinates system xy, is detected in succession by a coordinates measuring apparatus 39 using a laser interference measuring device or an encoder, and the detected coordinates position is processed by the control circuit 31 and used for the positioning of the stage.

Figure 4:
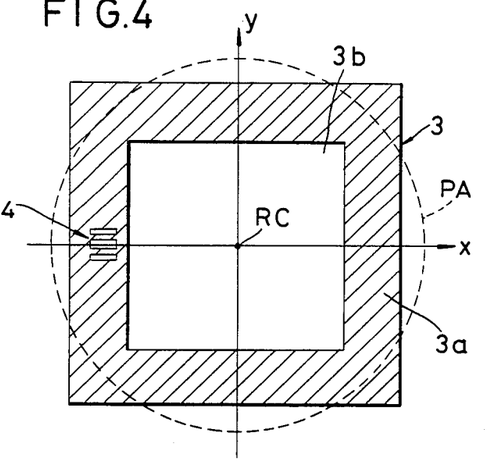
FIG. 4 is a plan view of a reticle.

The reticle 3, as shown in FIG. 4, may be provided by evaporating a thin film of metal such as chromium on the marginal portion of a rectangular glass plate to form a light-intercepting portion 3a, and forming a desired circuit pattern in an area 3b inside the light-intercepting portion. When the xy coordinates system is determined with the center RC of the reticle as the origin, the alignment mark 4 for aligning in direction y is provided on the outer peripheral side of the area 3b on the x-axis. The alignment mark in direction x is similarly provided on the y-axis. The alignment mark 4 is observed by the reflecting mirror 14, the first objective lens 15, the second objective lens 16 and the image pickup apparatus 21 shown in FIG. 1. The reticle is positioned so that the center RC thereof passes through the optic axis 5a of the projection lens. The position of the alignment mark 4 in direction x relative to the center RC is known in advance during the designing of the reticle. Therefore, by disposing the reticle as shown in FIG. 1 and moving the reflecting mirror 14 and the first objective lens 15 in the direction of the optic axis 13, the alignment mark is observed by the image pickup apparatus 21. The circular area PA indicated by a dotted line in FIG. 4 represents the maximum exposure area projectable by the projection lens, i.e., the so-called image field. Also, the alignment mark in direction x is disposed so as to be observed by another alignment optical system.

Figure 5:
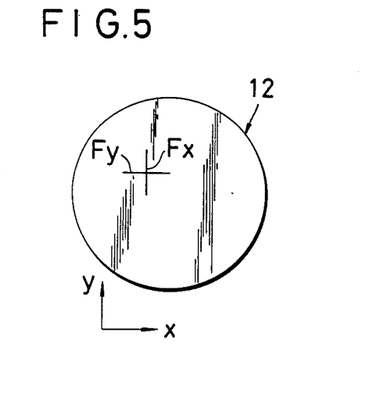
FIG. 5 is a plan view of a reference mark plate.

On the reference mark plate 12 shown in FIG. 5, a linear reference mark Fy extending in direction x and a linear reference mark Fx extending in direction y are provided in the form of a cross to make the position of the stage 10 correspond to the position of the projected image of the reticle.

Figure 6:
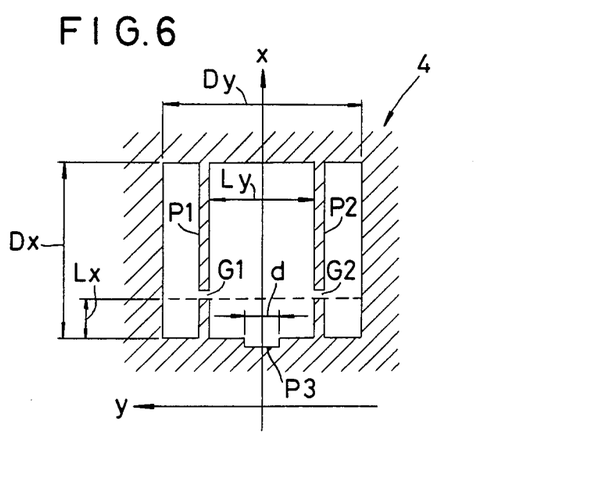
FIG. 6 is an enlarged plan view of the alignment mark of the reticle.

FIG. 6 is an enlarged view of the alignment mark 4 of the reticle. Assuming that the center line of the alignment mark is made coincident with the x-axis of the xy coordinates system, the alignment mark 4 is symmetrical in direction y with respect to the x-axis and is a rectangular transparent window having a length Dx in direction x and a length Dy in direction y. In this transparent window, two linear patterns P1 and P2 equidistant from the x-axis and having a spacing Ly therebetween are formed in parallelism to the x-axis. When the alignment mark 8 on the wafer is observed just at the center between these linear patterns P1 and P2, the pattern area 3b of the reticle and an area on the wafer which is to be exposed overlap each other accurately through the projection lens 5.

Minute gaps G1 and G2 are formed in the linear patterns P1 and P2, respectively, at a distance Lx in direction x from the base of the transparent window. No chromium layer is evaporated on the gaps G1 and G2, which thus have a light-transmitting property. Also, in the middle of the base of the transparent window, there is formed a minute recess P3 having a width d in direction y. This recess P3 is for aligning the mark Fy of the reference mark plate 12 by inserting it in direction y, and the width d is slightly greater than the width of the image of the mark Fy on the reticle. By aligning the mark Fy with the aid of this recess P3, it is possible to make the position of the reticle correspond to the position of the stage 10.

Operation of the present embodiment will now be described including, for example, a series of steps from the step of forming the first layer pattern on the wafer to the step of effecting exposure with the second layer pattern superposed on the first layer on the wafer.

Figure 7:
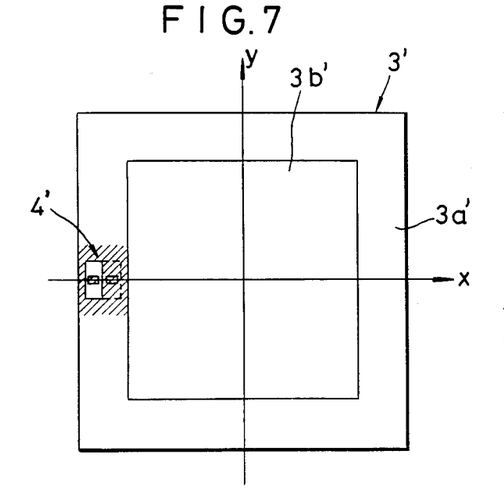
FIG. 7 is a plan view of a reticle for forming an alignment mark on a wafer.
Figure 8:
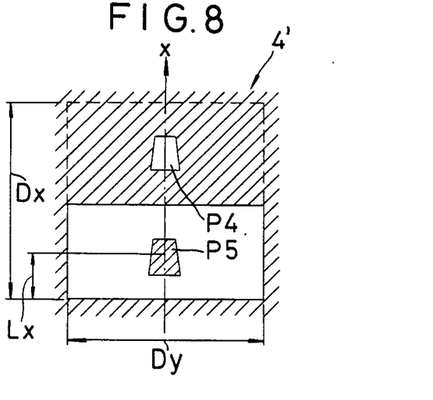
FIG. 8 is an enlarged plan view of alignment marks provided on the reticle of FIG. 7.

First, when the first layer pattern is to be exposed on the wafer 7 by the use of the exposure apparatus shown in FIG. 1, a reticle 3' shown in FIG. 7, instead of the reticle 3 shown in FIG. 4, is set on the exposure apparatus. The rectangular area 3b' of the reticle 3' is of the same size as the area 3b of the reticle 3, and the first layer pattern is depicted in this area 3b'. Of course, a light-intercepting area 3a' of a chromium layer is formed around the area 3b', and a mark 4' for making the alignment mark 8 on the wafer is provided at a position on the x-axis of the xy coordinates system which corresponds to the alignment mark 4 of the reticle 3. The mark 4', as shown in FIG. 8, is such that the rectangular area having a length Dx in direction x and a length Dy in direction y is bisected in direction x and the upper half, i.e., the inner half area with respect to the reticle 3', has its entire surface covered with a chromium layer and a trapezoidal pattern P4 having a light-transmitting property is provided at the center thereof. On the other hand, a rectangular transparent window is provided in the entire surface of the chromium layer of the outer half area, and a trapezoidal pattern P5 of the same size as the pattern P4 and having a light-intercepting property formed of a chromium layer is provided at the center thereof. Both of the two trapezoidal patterns P4 and P5 are disposed so as to be line-symmetrical with respect to the x-axis and particularly, the center of the trapezoidal pattern P5 is formed at a distance Lx in direction x from the base of the mark 4'. As regards the shape of the trapezoidal patterns P4 and P5, the inclination of the oblique sides thereof with respect to the x-axis is of the order of 1/9.

Exposure is repeated on the wafer in the step-and-repeat system by the use of the reticle 3' as described above, whereby the pattern of the area 3b' of the reticle 3' and the alignment mark 4' are arranged in the form of a matrix in accordance with the xy coordinates system. After the wafer has been developed, the process (etching, evaporation, etc.) for the first layer is carried out. Photoresist is again applied to the wafer on which the first layer has been thus formed, and the wafer is placed onto the stage 10 of the exposure apparatus of FIG. 1.

Figure 9:
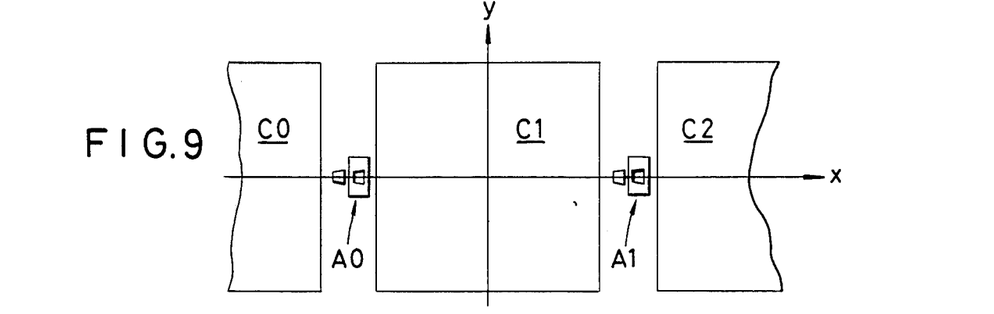
FIG. 9 shows chips and alignment marks formed on a wafer.
Figure 10:
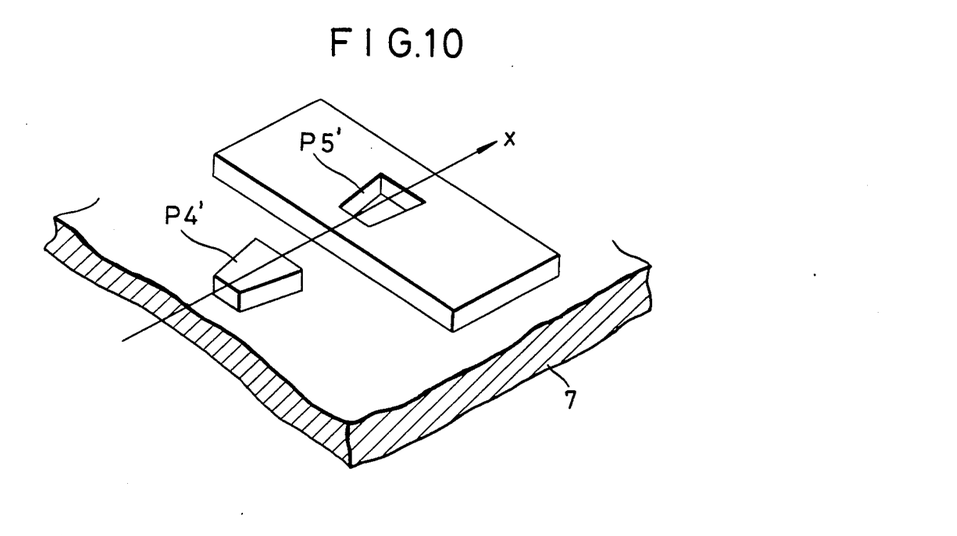
FIG. 10 is an enlarged perspective view of the alignment mark on the wafer.

The transfer pattern of the reticle 3', i.e., chips, is arranged at a predetermined pitch on the wafer on which the first layer has been formed, as shown, for example, in FIG. 9. In FIG. 9, three chips C0, C1 and C2 along the x-axis are typically shown near the center of the wafer. Between the chips C0 and C1, an alignment mark A0 provided by the mark 4' is formed collaterally to the chip C0, and between the chips C1 and C2, an alignment mark A1 provided by the mark 4' is formed collaterally to the chip C1. Both of the alignment marks A0 and A1 have patterns P4' and P5' as shown in FIG. 10 which correspond to the trapezoidal patterns P4 and P5 of the mark 4'. The patterns P4' and P5' are formed concavely or convexly on the surface of the wafer 7 depending on whether the photoresist of the first layer is positive or negative, or depending on the process. Assuming that in the present embodiment, the transparent portion of the mark 4' is projectedly formed on the wafer, the pattern P4' is a projection and the pattern P5' is a depression formed in a rectangular projection.

The surface of the wafer 7 on which the first layer has been formed is again covered with photoresist in preparation for the subsequent exposure using another reticle. During the alignment of this wafer and the next reticle, the illuminating light reflected by the surface of the photoresist film and the illuminating light reflected by the pattern P4' or the pattern P5' may interfere with each other.

Figure 11:
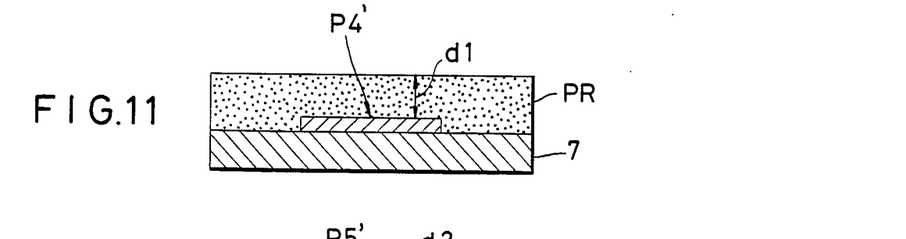
FIG. 11 is a cross-sectional view of the projected pattern of the alignment mark of the wafer.
Figure 12:
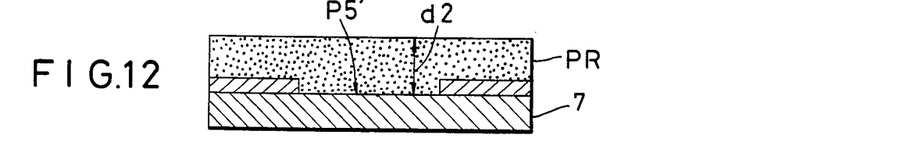
FIG. 12 is a cross-sectional view of the depressed pattern of the alignment mark of the wafer.

Therefore, if patterns P4' and P5' provided by a projection and a depression are formed as shown in FIGS. 11 and 12, when the thickness d1 of the resist film above the projection pattern P4' satisfies the interference condition, the probability with which the thickness d2 of the resist film above the depression pattern P5' is off the interference condition is very high. Therefore, one of the pair of patterns P4' and P5' in which no interference fringe is produced can be used for alignment.

Figure 13:
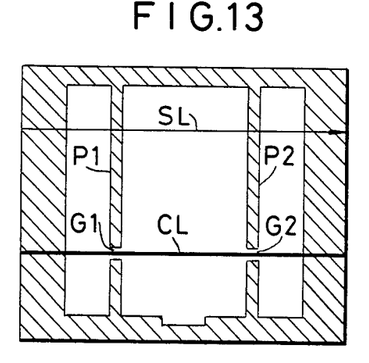
FIG. 13 shows the relation between the alignment mark of the reticle and a cursor line CL displayed on a CRT during initialization.

Now, during the exposure of the second layer, the reticle 3 shown in FIG. 4 is set on the exposure apparatus of FIG. 1. An illuminating light is emitted from the light guide 20 and the image of the alignment mark 4 of the reticle 3 is picked up by the image pickup apparatus 21. At this time, the stage 10 is retracted so that the illuminating light transmitted through the reticle may not be applied to the wafer. However, the reflecting surface of the reference mark plate 12 is disposed at the projected position of the alignment mark 4. In such a state, the operator observes the CRT 44 of FIG. 3 and executes the initialization of the signal processing circuit 30. First, the MPU 43 closes the switch 47 and displays the cursor line on the CRT 44 while, at the same time, it changes over the switch 49 and selects the set voltage Vr. While watching the CRT 44, the operator adjusts the variable resistor 46 so that the cursor line is positioned at the gaps G1 and G2 of the two linear patterns P1 and P2 of the alignment mark 4. The state at this time is shown in FIG. 13. The scanning line SL extends straight from the left end to the right end as viewed in FIG. 13 so that it is orthogonal to the linear patterns P1 and P2. The cursor line CL appears on a scanning line. This cursor line CL is aligned so that it is inserted into the respective gaps G1 and G2 of the linear patterns P1 and P2.

The MPU 43 reads in the set voltage Vr converted into a digital value by the ADC 50, and stores that value as the cursor position Dr. This reading-in is effected by the operator confirming the state as shown in FIG. 13 and then closing a switch, not shown. Finally, the MPU 43 opens the switch 47 to erase the cursor line CL displayed on the CRT 44, and also returns the switch 49 to its original position and selects the vertical scanning signal VS.

When the initialization is terminated, the control circuit 31 cooperates with the coordinates measuring device 39, the driving circuit 36, the stage 10 and a wafer alignment microscope, not shown, to effect the alignment of the wafer relative to the exposure apparatus body. This aligning method is known as disclosed, for example, in U.S. Pat. No. 4,385,838 issued on May 31, 1983 and is not directly related to the present invention and therefore need not be described herein. Then, the control circuit 31 effects the positioning of the stage 10 by the coordinates measuring device 39 so that, for example, the first chip C0 to be superposedly printed on the wafer and the projected image of the area 3b of the reticle are substantially aligned. Thereafter, when the illuminating light is emitted from the light guide 20, the images of the alignment marks 4 and A0 are superposedly formed on the image pickup surface 21a of the image pickup apparatus 21, as shown, for example, in FIG. 14.

Figure 14:
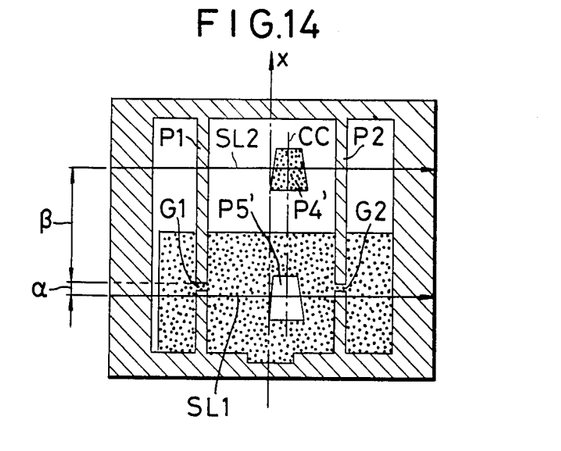
FIG. 14 shows the relation between the alignment mark of the reticle and the alignment mark of the wafer displayed on the CRT.

Hereupon, the operator compares the visible states of the trapezoidal patterns P4' and P5' displayed on the CRT 44 and chooses one of these patterns which has fewer interference fringes and which is of better contrast, and commands to the MPU 43 as to which of the two patterns is to be used. When it is commanded that the pattern P5' is to be used, the MPU produces such a data which chooses the scanning line SL1 as shown in FIG. 14 from among the scanning lines in one picture plane of the image pickup apparatus 21. This scanning line SL1 intersects the linear patterns P1 and P2 a predetermined amount $\alpha$ below the scanning line passing through the gaps G1 and G2, i.e., the cursor line CL displayed during the previous initialization. The MPU adds a value corresponding to $\alpha$ to the previously stored value Dr and again stores the addition value Dr1 therein. On the other hand, when it is commanded that the pattern P4' is to be used, the MPU produces a data for choosing a scanning line SL2. The scanning line SL2 is determined a predetermined amount $\beta$ above the gaps G1 and G2 so that it passes through the center of the pattern P4' when the scanning line SL1 has passed through the center of the pattern P5'. The MPU subtracts a value corresponding to $\beta$ from the value Dr and again stores the subtraction value Dr2 therein. In the following operation, it is assumed that the pattern P5' has been chosen.

Figure 15:
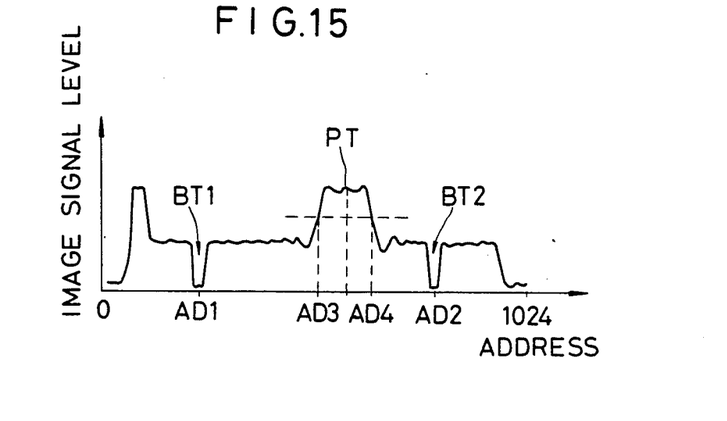
FIG. 15 shows the waveform of an image signal corresponding to a scanning line.

When the digital value of the vertical scanning signal VS which varies in accordance with the scanning position during the time that a picture plane is scanned has become coincident with the value Dr1, the MPU puts out to the RAM 41 and the counter 42 such a command which initiates the writing of the image signal of the scanning line SL1 into the RAM 41. The counter 42 counts up to 1024 in response to the horizontal synchronizing signal HS, and the image signal is stored in the area from 0 address to 1024 address of the RAM 41. FIG. 15 shows the distribution of intensity of the image signal on the scanning line SL1 stored in the RAM 41. The distribution is originally dispersive, but to facilitate the understanding, it is shown in a continuous waveform. In FIG. 15, the abscissa represents address and the ordinate represents the intensity (level) of the image signal.

Subsequently, the MPU reads out the image signal stored in the RAM 41 and finds out addresses AD1 and AD2 corresponding to the centers of the bottoms BT1 and BT2 of the waveform created in conformity with the linear patterns P1 and P2 of the alignment mark of the reticle. The peak portion PT of the waveform created in conformity with the pattern P5' exists in the section from the address AD1 to the address AD2.

By differentiating the section from the address AD1 to the address AD2, an address AD3 corresponding to the center of the rising of the peak portion PT and an address AD4 corresponding to the center of the falling of the peak portion PT are found. Accordingly, the difference between an address ADb situated at the center of the addresses AD1 and AD2 and an address ADa situated at the center of the addresses AD3 and AD4 is found, and the difference is multiplied by a constant k corresponding to the magnification of the projection lens and the magnification of the alignment optical system, whereafter the amount of relative positional deviation $\Delta y$ of the alignment mark 4 and the alignment mark 8 in direction y is converted into the amount of deviation on the wafer, which is thus obtained. In FIG. 14, the amount of deviation $\Delta y$ thus obtained is the amount of deviation in direction y between the center line (x-axis) of this linear patterns P1 and P2 and the center line CC of the trapezoidal patterns P4' and P5'.

The amount of deviation $\Delta y$ obtained in the manner described above is put out from the MPU to the control circuit 31, which thus finely moves the stage 10 in direction y by an amount corresponding to the amount of deviation $\Delta y$. Thereby, the alignment in direction y is completed. The alignment in direction x is also effected just in the same manner. The exposure light beam is applied to the thus aligned reticle for a predetermined time, whereby the chip C0 of the wafer is exposed to the light. When the exposure of the chip C0 to the light is terminated, the stage 10 is moved in direction x by a predetermined pitch so that the projected image of the area 3b and the chip C1 overlap each other, whereby the alignment of the alignment mark 4 and the alignment mark A1 is effected likewise.

Figure 16:
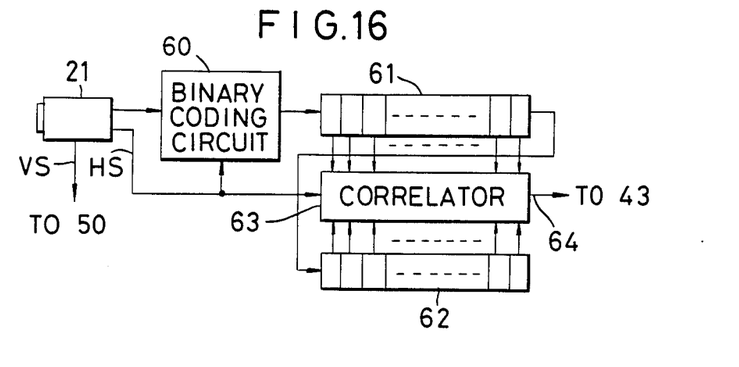
FIG. 16 is a circuit block diagram of a scanning line discriminating circuit.

In the above-described embodiment, from the viewpoint of the construction of the signal processing circuit 30, the design is such that the scanning line SL1 does not pass through the gaps G1 and G2 of the alignment mark 4, but if the construction as will be described below is adopted, the data value Dr corresponding to the position of the scanning line SL1 passing through the gaps G1 and G2 can be obtained without using the cursor line CL. The circuit of FIG. 16 is a scanning line discriminating circuit for taking the correlation between the image signal of the scanning line passing through the gaps G1 and G2 and the image signal of the scanning line crossing the linear patterns P1 and P2, and this circuit can be intactly added to the circuit of FIG. 3. The image signals from the image pickup apparatus 21 are input to a binary coding circuit 60 and are converted into time-serial binary signals of logic value "0" or "1" for each picture element in the scanning line. A shift register 61 receives the binary signals in succession as inputs and shifts each picture element corresponding to one scanning line by 1 bit each. Since the scanning line has 1024 picture elements, the shift register 61 is comprised of 1024 bits of memory elements. A shift register 62 also is of 1024 bits and is series-connected to the shift register 61. Accordingly, a binary signal corresponding to a scanning line during the scanning is stored in the shift register 61, and a binary signal corresponding to the scanning line preceding said scanning line is stored in the shift register 62. A digital correlator 63 compares the 1024 bits of data of the shift register 61 with the 1024 bits of data of the shift register 62, and puts out a signal 64 to the MPU 43 when the two data are not coincident with each other. The comparison is effected during the time from the termination of one scanning till the initiation of the next scanning, on the basis of the horizontal synchronizing signal HS. Also, the vertical scanning signal VS from the image pickup apparatus 21 is input to the ADC 50 of FIG. 3.

In such a construction, after the image pickup apparatus 21 has picked up only the image of the alignment mark 4 as shown in FIG. 13, the MPU 43 reads and stores the digital value of the ADC 50 when it detects the signal 64 from the digital correlator 63. The signal 64 is produced when the scanning line has shifted from a state in which it passes through the linear patterns P1 and P2 to a state in which it passes through the gaps G1 and G2, and the MPU stores therein the then level of the vertical scanning signal VS as the value Dr.

The alignment mark pair of the wafer used in the above-described alignment process comprises a projection mark P4' and a depression mark P5'. Accordingly, when the film thickness of the photoresist corresponding to one of the pair of marks satisfies the interference condition, the film thickness of the photoresist corresponding to the other mark does not satisfy the interference condition. Consequently, a preferred one of the pair of marks can be selected during the alignment.

Several preferred modifications of the alignment mark pair of the wafer will be shown below.

As previously described, the alignment mark of the wafer is comprised of a projection or a groove formed in the surface of a semiconductor substrate and is discriminated by a difference level formed between the projection or the groove and its surroundings. In the case of an alignment mark made via an anisotropic dry etching process, the difference level is generally sharp and interference fringes can be made hard to generate by reducing the size or width of the mark.

Figure 17A:
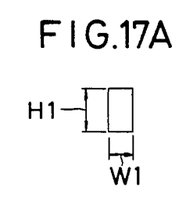
FIGS. 17A, 17B and 17C show the shapes of small alignment marks.
Figure 17B:
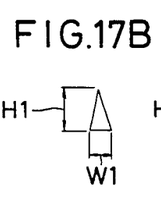
Figure 17C:
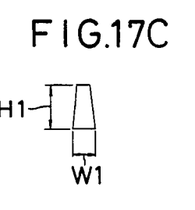

Three examples of the shape of the wafer alignment mark are shown in FIGS. 17A–17C. FIG. 17A shows a rectangular mark, FIG. 17B shows a triangular mark, and FIG. 17C shows a trapezoidal mark. The width W1 of each mark is W1<4 $\mu$m. This widthwise direction is a direction in which scanning is effected by the image pickup apparatus. On the other hand, the length H1 of each mark is determined by what degree of scanning the image pickup apparatus requires in this lengthwise direction, and actually it is 8–10 $\mu$m. The standard which determines the width W1 of the marks is W1$\lesssim$2 do when the difference level, i.e., the height of the projection or the depth of the groove, is do. Since do is 1–1.5 $\mu$m in the ordinary wafer process, the width W1 of the marks may preferably be 1–3 $\mu$m.

Figure 18A:
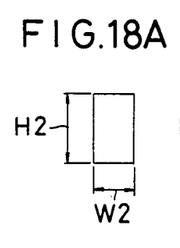
FIGS. 18A, 18B and 18C show the shapes of large alignment marks.
Figure 18B:
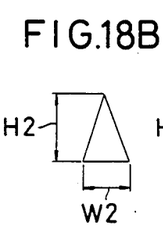
Figure 18C:
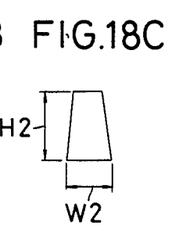

The surface of the photoresist film becomes substantially flat due to the action of the viscosity and surface tension of the photoresist and as a result, the variation in the thickness of the photoresist film becomes sharp in the difference level portion of the mark. Accordingly, only about one interference fringe is generated and the S/N ratio of the image signals of the image pickup apparatus becomes good. Where the wafer alignment mark is formed by the local oxidation of silicon (LOCOS) process, the inclination of the difference level of the alignment mark becomes gentle and therefore, it is often the case that if the width of the mark is made great, a good quality of image is obtained when the wafer alignment mark is optically superposed on the reticle mark after the application of photoresist. Therefore, if the large alignment marks as shown in FIGS. 18A–18C and the small alignment marks of FIGS. 17A–17C are formed on the same semiconductor substrate, the small alignment mark formed by the anisotropic dry etching process and the large alignment mark formed by the LOCOS process can selectively be photoelectrically converted by the image pickup apparatus. Thus, the optimum alignment mark corresponding to the mark forming process can be selected and the image thereof can be picked up. In FIGS. 18A–18C, the width W2 in the scanning direction of the image pickup apparatus may be 4 $\mu$m or more, and may preferably be, for example, W2=10 $\mu$m. The length H2 may be set as required, and it is possible that W2=H2.

Such a pair of large and small alignment marks are formed by the transfer to the wafer of the mark pattern provided in the area around the reticle used in the exposure step of the first layer to the wafer.

Figure 19:
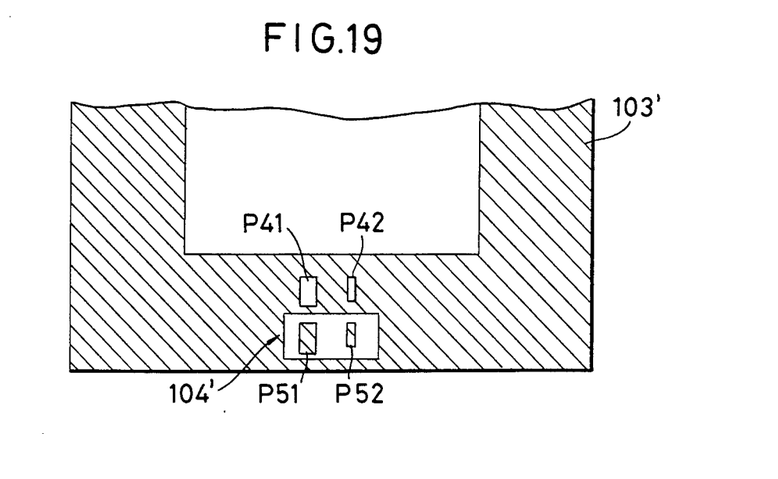
FIG. 19 is an enlarged view of the essential portions of a reticle for forming alignment marks on a wafer.

FIG. 19 shows a reticle 103' having a mark pattern 104' for forming two pairs of large and small marks on a semiconductor substrate. One pair comprises a large mark P41 and a small mark P42 having a light-transmitting property provided in the light-intercepting area by the chromium layer on the marginal portion of the reticle, and the other pair comprises a large mark P51 and a small mark P52 formed of chromium layers in a rectangular transparent window.

If an alignment mark is formed on a substrate by the use of this mark pattern 104', an optimum one can be selected during the alignment in conformity with the wafer processing step and the generated state of interference fringes.

What is claimed is:

1. An alignment method for aligning a photomask having a reference mark with a substrate covered with a photosensitive layer and printing the pattern of said photomask on said substrate, comprising the steps of:
   (a) providing on said substrate a pair of alignment marks spaced apart from each other by a predetermined distance in a mark area, said pair of alignment marks being formed as a projection and a depression relative to the surroundings, respectively;
   (b) providing said photosensitive layer on said substrate so that the outermost surface of said layer is substantially flat;
   (c) imaging said pair of alignment marks on an imaging plane by a light having a single wavelength;
   (d) comparing images of said pair of alignment marks on said imaging plane with each other in relation to the contrast of said images and determining which one of said images is of better contrast; and
   (e) aligning said photomask with said substrate by the use of said reference mark and one of said pair of alignment marks corresponding to said one image.

2. An alignment method according to claim 1, wherein said pair of alinment marks have substantially the same planar shape.

3. An alignment method according to claim 1, wherein said pair of alignment mark have substantially the same planar shape and size.

4. An alignment method according to claim 1, wherein said one image has fewer interference fringes than the image of the other of said pair of alignment marks.

5. An alignment method according to claim 1, wherein said reference mark and said pair of alignment marks are imaged superposedly on said imaging plane by said light.

6. An alignment method according to claim 1, wherein said substrate has a reference surface, said depression is formed in region projected from said reference surface and said projection is formed outside of said region.

7. An alignment method for aligning a photomask having a reference mark with a substrate covered with a photosensitive layer and printing the pattern of said photomask on said substrate, comprising the steps of:
   (a) providing on said substrate a pair of alignment marks spaced apart from each other by a predetermined distance in a mark area, said pair of alignment marks being formed as a projection and a depression relative to the surroundings thereof, respectively;

(b) providing said photosensitive layer on said substrate so that the outermost surface of said layer is substantially flat;
(c) illuminating said pair of alignment marks by a light having a single wavelength;
(d) comparing said pair of alignment marks with each other in relation to the contrast, and selecting one of said pair of alignment marks which is of better contrast; and
(e) aligning said photomask with said substrate by the use of said reference mark and the selected one alignment mark.

8. An alignment method according to claim 7, wherein said selected one alignment mark has fewer interference fringes than the other of said pair of alignment marks.

9. An alignment method for aligning a photomask having a reference mark with a substrate covered with a photosensitive layer and printing the pattern of said photomask on said substrate, comprising the steps of:
(a) providing on said substrate a group of alignment marks including first and second pairs of said alignment marks, the first pair including first and second marks of different sizes from each other which are projected with respect to the respective surroundings, and the second pair including third and fourth marks of the same sizes as the first and second marks, respectively, the third and fourth marks being depressed with respect to the respective surroundings;
(b) providing said photosensitive layer on said substrate so that the outermost surface of said layer is substantially flat;
(c) illuminating said group alignment marks by a light having a single wavelength;
(d) comparing said group of alignment marks with each other in relation to the contrast and selecting one of said group of alignment marks which is of better contrast; and
(e) aligning said photomask with said substrate by the use of said reference mark and the selected one alignment mark.

10. An alignment mark formed on a semiconductor substrate, comprising:
a projecting region projected from a reference surface of said substrate;
a depression formed in said projecting region; and
a projection formed outside of said projecting region and having substantially the same planar shape and size as said depression.

11. An alignment mark according to claim 10, wherein said depression and said projection are arranged along one direction on said reference surface and each of said depression and said projection determines a position in a direction perpendicular to said one direction.

* * * * *